(12) United States Patent
Saitou

(10) Patent No.: US 7,884,031 B2
(45) Date of Patent: Feb. 8, 2011

(54) SEMICONDUCTOR DEVICE

(75) Inventor: Yumi Saitou, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/484,423

(22) Filed: Jun. 15, 2009

(65) Prior Publication Data

US 2009/0309233 A1 Dec. 17, 2009

(30) Foreign Application Priority Data

Jun. 16, 2008 (JP) ............................ 2008-156461

(51) Int. Cl.
*H01L 21/31* (2006.01)
*H01L 21/469* (2006.01)

(52) U.S. Cl. ................. 438/774; 438/758; 257/E23.145

(58) Field of Classification Search ................. 257/774, 257/758, 760
See application file for complete search history.

(56) References Cited

U.S. PATENT DOCUMENTS

2008/0012147 A1* 1/2008 Watanabe ................. 257/774

FOREIGN PATENT DOCUMENTS

JP 08-264627 10/1996
JP 2007-115980 5/2007

OTHER PUBLICATIONS

Kurokawa et al., "Efficient Dummy Filling Methods to Reduce Interconnect Capacitance and Number of Dummy Metal Fills", IEICE Trans. Fundamentals, vol. E88-A, No. 12 Dec. 2005, pp. 3471-3478.

* cited by examiner

*Primary Examiner*—Phat X Cao
*Assistant Examiner*—Nga Doan
(74) *Attorney, Agent, or Firm*—Young & Thompson

(57) ABSTRACT

The semiconductor device includes an interconnect having a width of 0.1 μm or less and formed in an insulating layer constituted of a low relative dielectric constant film having a relative dielectric constant of 3.0 or lower, a via having a diameter of 0.1 μm or less and connected to the interconnect, and a dummy metal provided in the insulating layer. The dummy metal is located close to an end portion of the interconnect along an extension thereof, and the dummy metal and the interconnect are spaced by a distance of 0.3 μm or less.

10 Claims, 4 Drawing Sheets

SEMICONDUCTOR DEVICE

This application is based on Japanese patent application No. 2008-156461, the content of which is incorporated hereinto by reference.

BACKGROUND

1. Technical Field

The present invention relates to a semiconductor device.

2. Related Art

The recent progress in micronization of semiconductor chips has elicited the drawback of signal delay that takes place in an interconnect, and the improvement therefor has been required. One of the solutions is employing a low relative dielectric constant (hereinafter, low-k) film as an interlayer dielectric. Such technique can be found, for example, in JP-A No. H08-264627, JP-A No. 2007-115980, and in the non-patented document cited below.

For example, a semiconductor device 100 shown in FIG. 4 has been proposed.

The semiconductor device 100 includes a plurality of low-k layers 101 to 103 formed on a substrate (not shown), which respectively includes a lower interconnect 104, a via 105, and an upper interconnect 106.

[Patented document 1] JP-A No. H08-264627
[Patented document 2] JP-A No. 2007-115980
[Non-patented document 1] IEICE TRANS. FUNDAMENTALS, VOL. E88-A, No. 12 December 2005, Kurokawa et al, P3471-3478

In the highly micronized interconnect structure of latest semiconductor devices, the via diameter and the interconnect width have to be minute, and hence the connection area between the via and the interconnect is quite small. The semiconductor device is, therefore, prone to incur the following drawback which has not been observed in a conventional structure.

A tensile stress is originated in the low-k film based on a difference between the thermal expansion coefficient of the substrate and that of the low-k film. Specifically the low-k film itself is biased to shrink, and the biasing force of the low-k film in the shrinking direction applies the tensile stress to an end portion of the interconnect in contact with the low-k film. Such tensile stress often forms a void in a region including the interface between the lower interconnect 104 and the via 105.

In the case where an electron runs, for example from the upper interconnect 106 to the lower interconnect 104, under the state that the tensile stress is exerted, an atom constituting the conductor migrates by electromigration in response to the flow of the electron, to thereby further promote the formation of the void at the interface between the lower interconnect 104 and the via 105, where a barrier metal blocks the migration of the atom. The void formed at the interface, though small in volume, leads to such drawback as provoking a conduction failure, thereby degrading the reliability of the semiconductor device because of the poor performance of the interconnect.

SUMMARY

In one embodiment, there is provided a semiconductor device comprising an interconnect formed in an insulating layer constituted of a low relative dielectric constant film having a relative dielectric constant equal to or lower than 3.0; a via having a diameter equal to or less than 0.1 μm and connected to the interconnect; and a dummy metal provided in the insulating layer; wherein the dummy metal is located close to an end portion of the interconnect along an extension thereof; and the dummy metal and the interconnect are spaced by a distance equal to or less than 0.3 μm.

In the semiconductor device thus constructed, the dummy metal is located close to an end portion of the interconnect along the extension thereof, and the dummy metal and the interconnect are spaced by a distance equal to or less than 0.3 μm.

Such structure suppresses the formation of a void at the interface between the via and the interconnect. It is for the following reason that such advantage can be attained.

The dummy metal and the end portion of the interconnect are located so as to hold the insulating layer therebetween. In other words, the insulating layer is fixed between the dummy metal and the end portion of the interconnect. This makes it difficult for the insulating layer to be deformed even though the end portion of the interconnect is pulled toward the insulating layer by the stress in the shrinking direction thereof, thereby suppressing creation of a situation that encourages the formation of a void at the interface between the interconnect and the via.

Consequently, a highly reliable semiconductor device can be obtained.

It should be noted that the foregoing effect can be attained in the case where the distance between the dummy metal and the end portion of the interconnect is equal to or less than 0.3 μm.

Meanwhile, in a semiconductor device, an interconnect may be located close to an end portion of another interconnect, depending on the design rule of the interconnect or other factors.

Conventionally, however, locating a dummy metal close to an end portion of an interconnect, specifically at or within 0.3 μm from the end portion of the interconnect, has not been practically conceived.

Although the dummy metal is located in the vicinity of an end portion of the interconnect, for example in the patented documents 1 and 2, it can be construed that the dummy metal is not located as close as 0.3 μm or less from the end portion of the interconnect.

It is because of the concern about emergence of a parasitic capacitance between the interconnect and the dummy pattern, which leads to an increase in interconnect capacitance and hence to degradation in circuit performance, that the dummy metal is kept from being located as close as 0.3 μm or less from the end portion of the interconnect. For example, FIG. 4 of the non-patented document 1 indicates that locating the dummy metals at or within 1 μm from each other incurs a sharp increase in parasitic capacitance. The non-patented document 1 concludes, on the other hand, that locating the dummy metals at 0.5 μm or farther from each other allows alleviating the impact of the increase in parasitic capacitance. Although the non-patented document 1 refers to the parasitic capacitance between the dummy metals, the same conclusion naturally applies to the parasitic capacitance between the dummy metal and the interconnect.

Another reason that the dummy metal is kept from being located very close to an end portion of an interconnect is that, in a process of forming an interconnect trench and a dummy pattern trench by etching, the position of an opening on the mask for the respective trench may be shifted.

Accordingly, it has generally been a technical common sense to locate the dummy pattern at 1 μm or farther, and at least 0.5 μm or farther from the interconnect. Consequently, it is difficult to suppress formation of a void at an interface between an interconnect and a via in the conventional semiconductor device.

The present invention provides a semiconductor device that suppresses formation of a void at an interface between an interconnect and a via, and thereby assures higher reliability.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
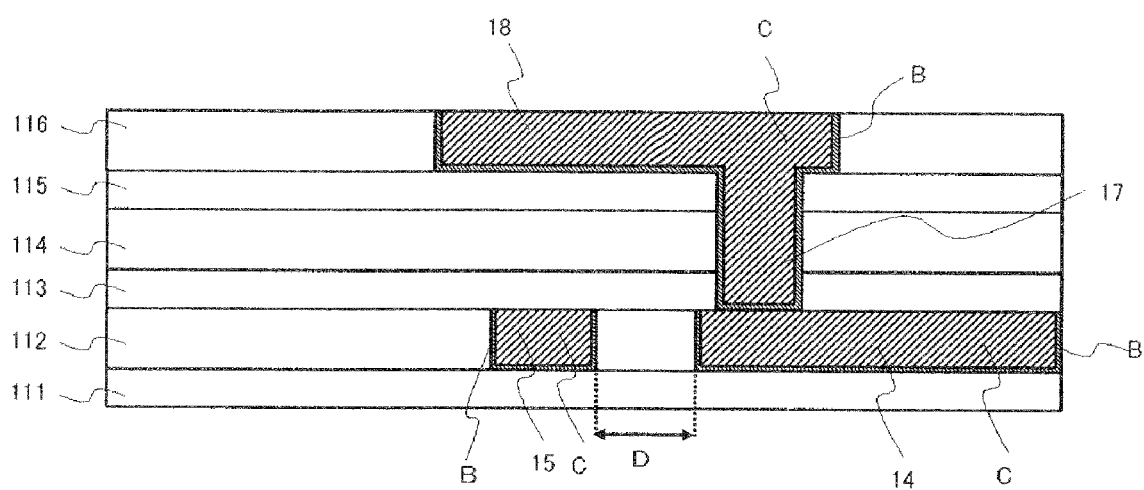
FIG. 1 is a cross-sectional view showing a semiconductor device according to an embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an embodiment of the present invention will be described referring to the drawings. The outline of a semiconductor device 1 according to the embodiment will be first described.

The semiconductor device 1 according to this embodiment includes an interconnect (lower interconnect) 14 having a width of 0.1 μm or less and formed in an insulating layer 112 constituted of a low-k material having a relative dielectric constant of 3.0 or lower, a via 17 having a diameter of 0.1 μm or less and connected to the interconnect 14, and a dummy metal 15 formed in the insulating layer 112, and the dummy metal 15 is located close to an end portion of the interconnect 14 along the extension thereof, such that an distance D between the dummy metal 15 and the interconnect 14 is equal to or less than 0.3 μm.

The semiconductor device 1 according to this embodiment will now be described in further details.

As shown in FIG. 1, the semiconductor device 1 includes a first insulating layer (not shown) provided on a substrate neither shown, a first cover layer 111, a second insulating layer 112 formed over the first cover layer 111, an etch-stopper layer 113 provided over the second insulating layer 112, a third insulating layer 114 provided over the etch-stopper layer 113, a second cover layer 115 provided over the third insulating layer 114, and a fourth insulating layer 116 provided over the second cover layer 115.

The substrate is a semiconductor substrate, such as a silicon substrate. Although not shown, the substrate includes a transistor.

The first cover layer 111 and the second cover layer 115 may be constituted of $SiO_2$, for example. The second cover layer 115 serves to protect the third insulating layer 114 in a CMP process for polishing the upper interconnect.

The etch-stopper layer 113 serves as an etch-stopper in a process of forming a via hole. The etch-stopper layer 113 may be constituted of, for example, SiCN, SiN, SiC, SiOF and SiON.

The insulating layers 112, 114, 116 are low-k films having a relative dielectric constant of 3.0 or lower. Examples of the material constituting those insulating layers include SiOC, polyhydrogen siloxane such as hydrogen silsesquioxane (HSQ), methylsilsesquioxane (MSQ), and methylated hydrogen silsesquioxane (MHSQ), organic materials containing an aromatic compound such as polyarylether (PAE), divinylsiloxane-bis-benzocyclobutene (BCB), and Silk (registered trademark), SOG, flowable oxide (FOX), CYTOP, and benzocyclobutene (BCB). In this embodiment a porous film constituted of one of those materials is employed as the insulating layers 112, 114, 116.

The insulating layer 112 includes a plurality of lower interconnects 14.

The lower interconnect 14 is, for example, a lowermost interconnect of the semiconductor device.

The lower interconnect 14 has a width of 0.1 μm or less. The lower interconnect 14 is arranged in a predetermined interconnect pitch.

Figure 2:
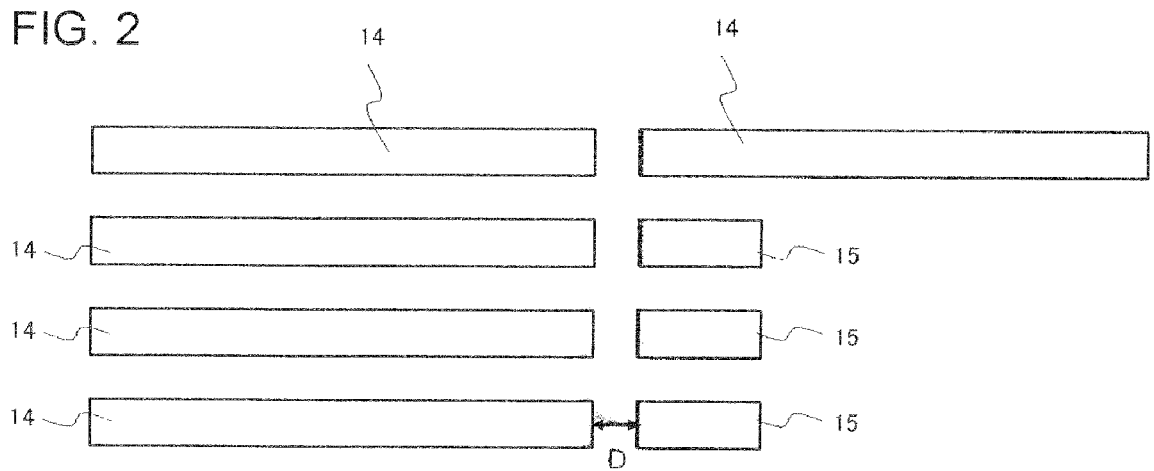
FIG. 2 is a plan view showing a lower interconnect and a dummy metal, viewed from a substrate.

Referring now to FIG. 2, in the vicinity of an end portion of some of the lower interconnects 14 (specifically, in a region of 0.3 μm or less from the end portion of the lower interconnect 14), another lower interconnect 14 is not located.

Close to such lower interconnects 14, the dummy metal 15 is disposed so as to oppose the end portion of the respective lower interconnects 14.

Here, FIG. 2 depicts the lower interconnect 14 and the dummy metal 15 viewed from the side of the substrate.

The dummy metal 15 is not for use as an interconnect, and hence electrically floating. The dummy metal 15 is formed in the same interconnect layer that includes the lower interconnect 14, and located on an extension line of the lower interconnect 14, along the extending direction thereof. Accordingly, the dummy metal 15 is located so as to hold the insulating layer 112 between the end portion of the lower interconnect 14 and itself.

The distance D between the dummy metal 15 and the lower interconnect 14 is 0.3 μm or less. Here, although a lower limit of such distance is not specifically limited, it is preferable to secure an interval of 0.1 μm or more, from the viewpoint of the design standard, processability of the interconnect trench, and the balance with the parasitic capacitance.

Figure 3:
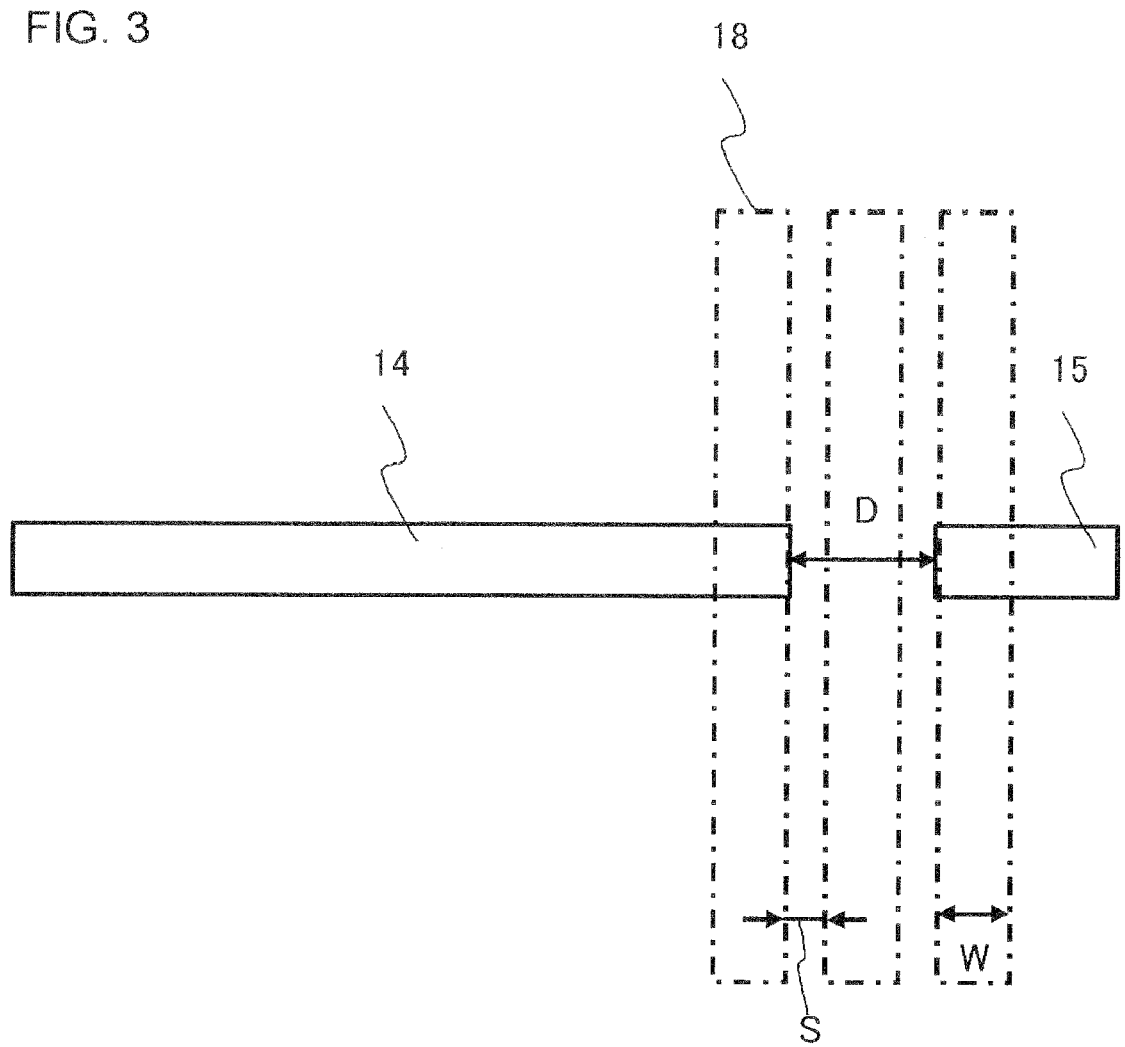
FIG. 3 is a diagram for explaining a method of determining the distance between the dummy metal and the lower interconnect.

Referring now to FIG. 3, a method of determining the distance D will be described hereunder.

At the stage of designing the interconnect layout, the upper interconnect 18 is disposed orthogonal to the longitudinal direction (extending direction) of the lower interconnect 14. Then the distance D may be decided so as to satisfy $D=2S+W$ (S is 0.1 μm or less, W is 0.1 μm or less), where S represents the pitch of the upper interconnect 18 and W the width thereof. Adopting such method allows easily determining the distance D, and simplifies the designing of the layout of the dummy metal 15 and the interconnect 14.

The dummy metal 15 is constituted of the same conductive material as that constituting the lower interconnect 14. For example, in the case where the lower interconnect 14 is constituted of a barrier metal layer B provided along the interconnect trench and a copper layer C provided inside the barrier metal layer B, the dummy metal 15 is also constituted of the barrier metal layer B and the copper layer C.

A face of the dummy metal 15 opposing the end portion of the lower interconnect 14 is not smaller than a face of the end portion of the interconnect 14 opposing the dummy metal 15. More strictly, the dummy metal 15 has a width equal to or wider than that of the lower interconnect 14, and the dummy metal 15 has a height equal to or higher than that of the lower interconnect 14.

In this embodiment, the face of the dummy metal 15 opposing the end portion of the lower interconnect 14 is of the same size as the face of the end portion of the interconnect 14 opposing the dummy metal 15. In other words, the dummy metal 15 has the same width as that of the lower interconnect 14, and the same height as that of the lower interconnect 14.

Upon viewing the lower interconnect 14 from the side of the dummy metal 15, therefore, the dummy metal 15 completely covers the lower interconnect 14.

Also, the dummy metal 15 has a length along the extending direction of the lower interconnect 14 longer than the height of the dummy metal 15, and hence the dummy metal 15 has a rectangular cross-section. The dummy metal 15 is, for example, 0.3 µm in length and 0.2 µm in height.

Further, the dummy metal 15 has a width narrower than the length thereof (length along the extending direction of the lower interconnect 14), and is hence of a rectangular shape.

Thus, the dummy metal 15 is a parallelepiped.

The via 17 is provided so as to penetrate through the second cover layer 115, the third insulating layer 114, and the etch-stopper layer 113. The via 17 is connected to the end portion of the lower interconnect 14 on the side of the dummy metal 15. The via 17 has a diameter of 0.1 µm or less. From the viewpoint of processability, it is preferable that the via 17 is formed in a diameter of 0.06 µm or larger.

The upper interconnect 18 is provided in the fourth insulating layer 116. The width of the upper interconnect 18 is 0.1 µm or less. To an end portion of the upper interconnect 18, the via 17 is connected. The upper interconnect 18 and the via 17 are formed through a dual Damascene process. More specifically, the barrier metal layer B is formed so as to cover the via hole and the trench for the upper interconnect 18, and then the copper layer C is formed so as to fill in the inside of the barrier metal layer B.

A method of manufacturing the semiconductor device 1 according to this embodiment will now be described.

First, a substrate with a transistor formed therein is prepared.

On the substrate, the first insulating layer (not shown) is formed, and then the first cover layer 111 is formed thereon. Then the first insulating layer and the first cover layer 111 are selectively removed so as to form a hole. The hole is filled, so as to form a via (riot shown). This via is connected to the transistor in the substrate.

On the first cover layer 111, the second insulating layer 112 is formed. Then the second insulating layer 112 is selectively removed so as to form the trench for the lower interconnect and the trench for the dummy metal.

The dummy metal trench and the lower interconnect trench may be formed at a time by etching. The barrier metal layer B is then formed so as to cover the inner wall of the dummy metal trench and the lower interconnect trench, and further the copper layer C is formed so as to fill in the inside of the barrier metal layer B. Performing then a CMP process or the like so as to remove an unnecessary portion of the copper layer C and the barrier metal layer B completes the formation of the lower interconnect 14 and the dummy metal 15.

Then the etch-stopper layer 113, the third insulating layer 114, the second cover layer 115, and the fourth insulating layer 116 are deposited, and the via hole and a trench for the upper interconnect are formed.

The barrier metal layer B is then formed so as to cover the inner wall of the via hole and that of the upper interconnect trench, and the copper layer C is formed so as to fill in the inside of the barrier metal layer B.

Performing then a CMP process or the like so as to remove an unnecessary portion of the copper layer C and the barrier metal layer B completes the formation of the via 17 and the upper interconnect 18.

The semiconductor device 1 can be obtained throughout the foregoing process.

The foregoing embodiment provides the following advantageous effects.

Figure 4:
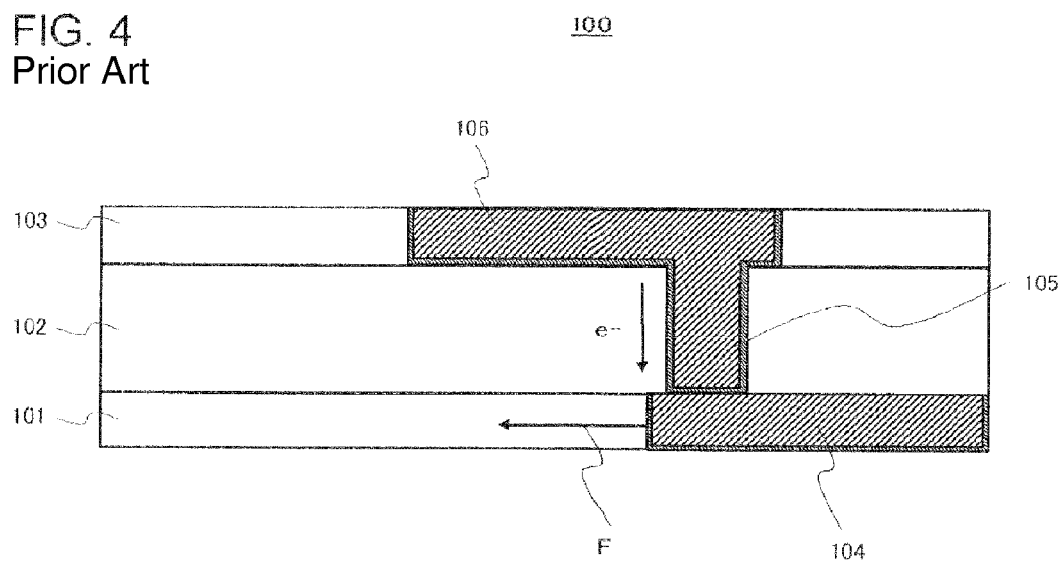
FIG. 4 is a cross-sectional view showing a conventional semiconductor device.

As stated earlier, generally a low-k film incurs a stress in a shrinking direction. Such stress pulls the end portion of the lower interconnect in a direction indicated by the arrow F in FIG. 4. In the conventional semiconductor device, therefore, a void is prone to be formed at the interface between the lower interconnect and the via.

In contrast, in this embodiment the dummy metal 15 is located close to the end portion of the lower interconnect 14 along the extension thereof, such that the distance D between the dummy metal 15 and the lower interconnect 14 is equal to or less than 0.3 µm.

Such structure suppresses the formation of the void at the interface between the via 17 and the lower interconnect 14. Presumably, this advantage can be attained for the following reason.

Generally the low-k film suffers a tensile stress originating from a difference in thermal expansion coefficient from the substrate and biasing the low-k film to shrink. Accordingly, the low-k film itself incurs a stress in a shrinking direction as indicated by the arrow F in FIG. 4. The low-k film employed in this embodiment, in particular, is a porous film which is mechanically vulnerable, and is therefore prone to be deformed because of the shrinking force of itself.

However, providing the dummy metal 15 as in this embodiment at a position not farther than 0.3 µm from the end portion of the lower interconnect 14 so as to hold the insulating layer 112 therebetween makes it difficult for the insulating layer 112, now fixed between the dummy metal 15 and the lower interconnect 14, to move. Thus the lower interconnect 14 is exempted from being pulled in the direction of the arrow F in FIG. 4, which prevents creation of the situation that encourages the formation of a void at the interface between the lower interconnect 14 and the via 17.

In this embodiment, accordingly, the formation of the void provoked by the electromigration can be suppressed, when the electron runs from the upper interconnect 18 to the lower interconnect 14 through the via 17.

Consequently, this embodiment provides the semiconductor device 1 with upgraded reliability.

It is to be noted that, since the via 17 and the upper interconnect 18 are integrally formed through the dual Damascene process in this embodiment, it is scarcely possible that a void is formed between the via 17 and the upper interconnect 18.

Meanwhile, as stated earlier, although the dummy metal is located in the vicinity of an end portion of the interconnect in the patented documents 1 and 2, it can be construed that the dummy metal is not located as close as 0.3 µm or less from the end portion of the interconnect.

It is because of the concern about emergence of a parasitic capacitance between the interconnect and the dummy pattern, which leads to an increase in interconnect capacitance and hence to degradation in circuit performance, that the dummy metal is kept from being located as close as 0.3 µm or less from the end portion of the interconnect. For example, FIG. 4 of the non-patented document 1 indicates that locating the dummy metals at or within 1 µm from each other incurs a sharp increase in parasitic capacitance. The non-patented document 1 concludes, on the other hand, that locating the dummy metals at 0.5 µm or farther from each other allows alleviating the impact of the increase in parasitic capacitance. Although the non-patented document 1 refers to the parasitic capacitance between the dummy metals, the same conclusion naturally applies to the parasitic capacitance between the dummy metal and the interconnect.

Another reason that the dummy metal is kept from being located very close to an end portion of an interconnect is that, in a process of forming an interconnect trench and a dummy pattern trench by etching, the position of an opening on the mask for the respective trench may be shifted.

Accordingly, it has generally been a technical common sense to locate the dummy pattern at 1 µm or farther, and at least 0.5 µm or farther from the interconnect. It is to be assumed, therefore, that the conventional dummy pattern is not intended for the same function as that performed by the dummy metal 15 according to this embodiment.

Also, in this embodiment the dummy metal 15 is located close to the end portion of the lower interconnect 14 along the extension thereof. Such location of the dummy metal 15 makes the area of the opposing portion of the dummy metal 15 and the lower interconnect 14 smaller than in the case of locating the dummy metal parallel to the lower interconnect 14 along a longitudinal direction thereof. Accordingly, the increase in parasitic capacitance can also be minimized. Thus, the semiconductor device 1 according to this embodiment exhibits an excellent balance between the increase in parasitic capacitance and the life time of the semiconductor device.

In this embodiment, also, the dummy metal 15 is located close to the end portion connected to the via 17 of the lower interconnect 14. Since the end portion of the lower interconnect 14 is pulled by the shrinking stress of the insulating layer 112, the void is more prone to be formed at the interface between the via 17 and the lower interconnect 14, in the case where the via 17 is connected to the end portion of the lower interconnect 14. Providing the dummy metal 15 as in this embodiment, therefore, effectively suppresses the formation of the void.

Further, in this embodiment, the face of the dummy metal 15 opposing the end portion of the lower interconnect 14 has an area equal to or larger that of the face of the end portion of the lower interconnect 14 opposing the dummy metal 15. Such configuration assures that the dummy metal 15 and the end portion of the lower interconnect 14 securely hold the insulating layer 112 therebetween. Thus the lower interconnect 14 is exempted from being pulled in the direction of the arrow F in FIG. 4, which prevents creation of the situation that encourages the formation of a void at the interface between the lower interconnect 14 and the via 17.

In this embodiment, furthermore, the dummy metal, 15 has a length along the extending direction of the lower interconnect 14 longer than the height of the dummy metal 15. Forming thus the dummy metal so as to have a rectangular cross-section grants the dummy metal 15 with sufficient stability in shape against the pulling force of the insulating layer 112.

It is to be understood that the present invention is not limited to the foregoing embodiment, and that any modification and improvement within a range that achieves an object of the present invention is duly included in the present invention.

To cite a few examples, although the upper interconnect 18 and the via 17 are formed through the dual Damascene process in the foregoing embodiment, the upper interconnect 18 and the via 17 may be formed through a single Damascene process.

Also, the dummy metal may be provided close to the end portion of the upper interconnect 18, in the case where another interconnect is provided above the upper interconnect 18 such that the further upper interconnect and the upper interconnect 18 are connected through a via. In this case also, the dummy metal may be located, as in the embodiment, close to the end portion of the upper interconnect 18 along the extension thereof, at a position not farther than 0.3 µm from the end portion thereof.

Further, although the lower interconnect 14 is the lowermost interconnect in the embodiment, the structure according to the present invention may be applied to an interconnect layer of any level.

EXAMPLES

The following passages will describe examples of the present invention.

Example 1

A semiconductor device was made up in a structure according to the foregoing embodiment.

The semiconductor device was formed so as to include, as in the embodiment, the first insulating layer, the first cover layer, the second insulating layer, the etch-stopper layer, the third insulating layer, the second cover layer, and the fourth insulating layer, provided over a substrate including a transistor formed therein.

The first insulating layer, the second insulating layer, and the third insulating layer were all made of SiOC.

The first cover layer and the second cover layer were made of $SiO_2$, and the etch-stopper layer was made of SiCN.

To form the lower interconnect and the dummy metal, Ta/TaN was employed as the barrier metal layer, and the copper layer was formed so as to fill in the inside of the barrier metal layer.

The upper interconnect and the via were also made of the same materials as those of the lower interconnect and the dummy metal, however the via and the upper interconnect were formed through the dual Damascene process.

Also, in the vicinity of an end portion of some of the lower interconnects (specifically, in a region of 0.3 µm or less from the end portion of the lower interconnect) another lower interconnect was not provided.

Close to such lower interconnects, the dummy metal was disposed so as to oppose the end portion of the respective lower interconnects. The distance D between the dummy metal and the end portion of the lower interconnect was 0.2 µm.

The width of the lower interconnect was 0.1 µm, and the height thereof was 0.2 µm.

The dummy metal was given an interconnect width of 0.1 µm, a height of 0.2 µm, and a length (along the extension of the lower interconnect) of 0.4 µm.

The via was formed in a diameter of 0.1 µm.

The width of the upper interconnect was 0.1 µm, and the height thereof was 0.2 µm.

Example 2

The example 2 was made up in the same structure as the example 1, except that the distance D between the dummy metal and the lower interconnect was set to be 0.3 µm.

Example 3

The example 3 was made up in the same structure as the example 1, except that the distance D between the dummy metal and the lower interconnect was set to be 0.05 µm.

Comparative Example 1

The comparative example 1 was made up in the same structure as the working example 1, except that the distance D between the dummy metal and the lower interconnect was set to be 0.4 μm.

Comparative Example 2

The comparative example 2 was not given the dummy metal. Otherwise, the comparative example 2 was the same as the working example 1.

[Evaluation Method]

The semiconductor devices made up as examples 1 to 3 and the comparative examples 1, 2 were evaluated as follows.

The semiconductor devices were placed in a furnace set at a temperature of 350° C. A current of a predetermined value was supplied to the semiconductor devices. The current value was set at $2\times10^6$ A/cm$^2$. The current was continuously supplied until the resistance value sharply rose (for example, the resistance increased by 2% or more from the initial value), at which point it was assumed that the life of that semiconductor device ended.

TABLE 1

|  | LIFE TIME (HOURS) |
| --- | --- |
| EXAMPLE 1 | 50 |
| EXAMPLE 2 | 40 |
| EXAMPLE 3 | 60 |
| COMPARATIVE EXAMPLE 1 | 20 |
| COMPARATIVE EXAMPLE 2 | 10 |

The working examples 1 to 3 exhibited a sufficiently long life time, and proved to be practically usable.

In contrast, the comparative examples 1, 2 presented a short life time. This is because in examples 1 to 3 formation of a void is suppressed at the interface between the lower interconnect and the via, while in the comparative examples 1, 2 a void is prone to be formed at the interface between the lower interconnect and the via.

Also, as a result of experiments with the insulating layers formed of different materials, the advantageous effect of suppressing the formation of the void was obtained, in the case of setting the distance D to be 0.3 μm or less.

Further, it is considered to be preferable to set the distance D to be 0.1 μm or more, from the viewpoint of suppressing the parasitic capacitance.

It is apparent that the present invention is not limited to the above embodiment, and may be modified and changed without departing from the scope and spirit of the invention.

What is claimed is:

1. A semiconductor device, comprising:
an interconnect formed extending along an extension direction in an insulating layer constituted of a low relative dielectric constant film having a relative dielectric constant equal to or lower than 3.0;
a via having a diameter equal to or less than 0.1 μm and connected to said interconnect; and
a dummy metal provided in said insulating layer, said dummy metal having a rectangular shaped, such that a length of said dummy metal along the extension direction is greater than a height of said dummy metal,
wherein said dummy metal is located close to an end portion of said interconnect along said extension direction, and
said dummy metal and said interconnect are spaced by a distance equal to or less than 0.3 μm.

2. The semiconductor device according to claim 1, wherein said dummy metal has a floating potential.

3. The semiconductor device according to claim 1, wherein said via is connected to said end portion of said interconnect.

4. The semiconductor device according to claim 1, wherein said interconnect has a width equal to or less than 0.1 μm.

5. The semiconductor device according to claim 1, wherein a face of said dummy metal opposing said end portion of said interconnect has a size equal to or larger than that of a face of said end portion of said interconnect opposing said dummy metal.

6. The semiconductor device according to claim 1, wherein said insulating layer is essentially constituted of a porous film.

7. The semiconductor device according to claim 1, wherein said dummy metal and said interconnect are essentially constituted of the same material.

8. The semiconductor device according to claim 1, further comprising an upper level interconnect provided at an upper position from said interconnect; wherein said via serves to connect said interconnect and said upper level interconnect; and said via and said upper level interconnect include a structure formed through a dual Damascene process.

9. The semiconductor device according to claim 8, wherein the dummy metal is spaced apart from an outermost edge of the upper level interconnect along the extension direction.

10. The semiconductor device according to claim 9, wherein the upper level interconnect covers the dummy metal.

* * * * *